(12) United States Patent
Shih

(10) Patent No.: US 10,410,910 B1
(45) Date of Patent: Sep. 10, 2019

(54) METHOD FOR PREPARING SEMICONDUCTOR STRUCTURES

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/105,266

(22) Filed: Aug. 20, 2018

(51) Int. Cl.
| | |
|---|---|
| *H01L 21/76* | (2006.01) |
| *H01L 21/762* | (2006.01) |
| *H01L 21/02* | (2006.01) |
| *H01L 21/3105* | (2006.01) |

(52) U.S. Cl.
CPC .. *H01L 21/76229* (2013.01); *H01L 21/02164* (2013.01); *H01L 21/02238* (2013.01); *H01L 21/76227* (2013.01); *H01L 21/31053* (2013.01)

(58) Field of Classification Search
CPC ......... H01L 21/76229; H01L 21/02164; H01L 21/02238; H01L 21/76227
USPC ........................................................ 438/427
See application file for complete search history.

(56) References Cited

U.S. PATENT DOCUMENTS

| | | | | |
|---|---|---|---|---|
| 4,666,556 A | * | 5/1987 | Fulton ................... | H01L 21/743 148/DIG. 50 |
| 5,691,230 A | * | 11/1997 | Forbes .................... | H01L 21/32 148/DIG. 50 |
| 6,204,145 B1 | * | 3/2001 | Noble ............... | H01L 21/76264 257/254 |
| 2014/0015096 A1 | * | 1/2014 | Lee ....................... | H01L 23/525 257/530 |
| 2018/0068856 A1 | * | 3/2018 | Horie ................ | H01L 29/66734 |

* cited by examiner

*Primary Examiner* — David S Blum
(74) *Attorney, Agent, or Firm* — Muncy, Geissler, Olds & Lowe, P.C.

(57) ABSTRACT

The present disclosure provides a method for preparing semiconductor structures. The method includes the following steps. A substrate is provided. A plurality of first trenches, a plurality of second trenches, a plurality of first island structures and a plurality of second island structures are formed. Each of the first island structures is separated from each of the second island structures by the first trenches. The plurality of first island structures are separated from each other by the second trenches, and the plurality of second island structures are separated from each other by the second trenches. A first dielectric layer is then conformally formed to cover sidewalls and a bottom of each first trench and sidewalls and a bottom of each second trench. A semiconductor layer is formed on the first dielectric layer. An oxidation is performed to convert the semiconductor layer into a semiconductor oxide layer in each of the first trenches and each of the second trenches. A second dielectric layer is then formed to fill the plurality of second trenches.

18 Claims, 13 Drawing Sheets

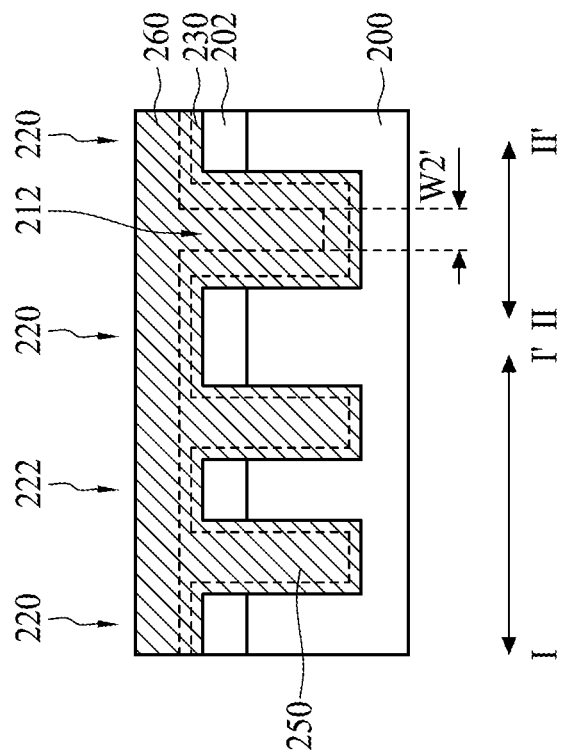
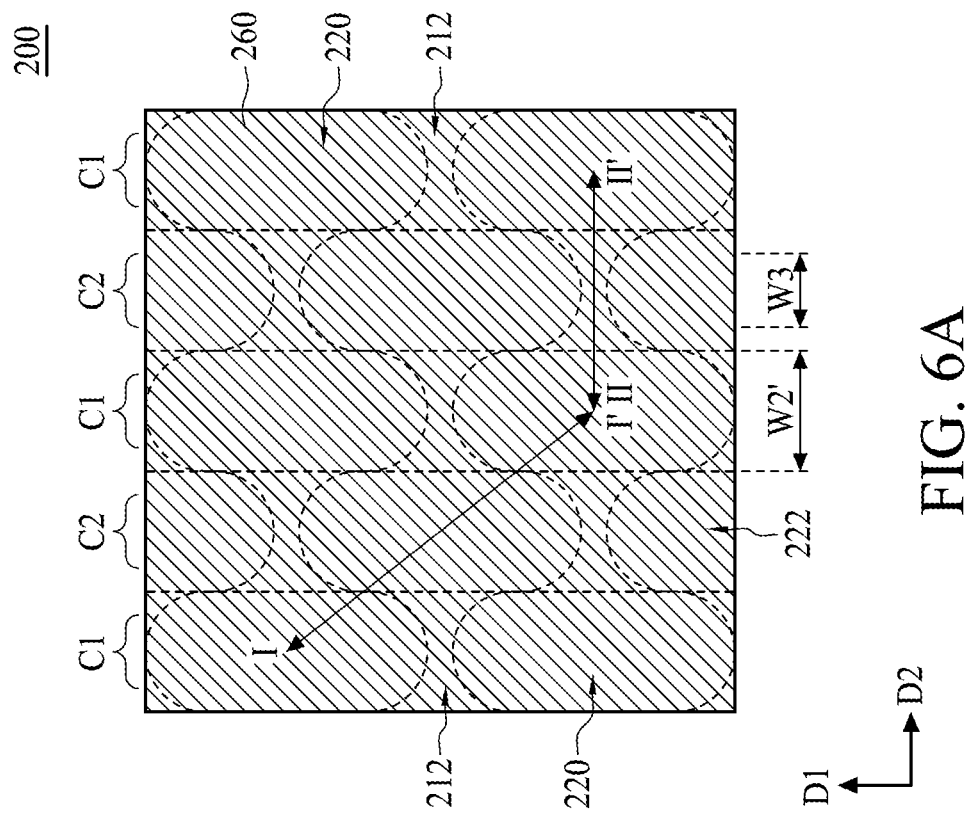
FIG. 6A
FIG. 6B

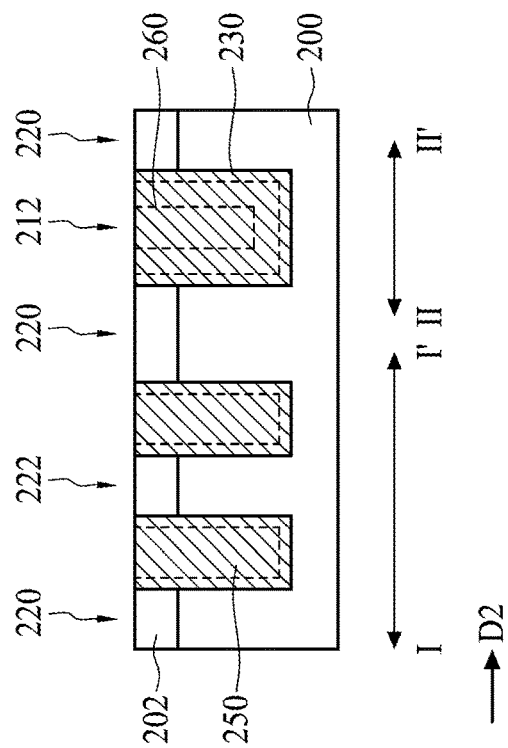
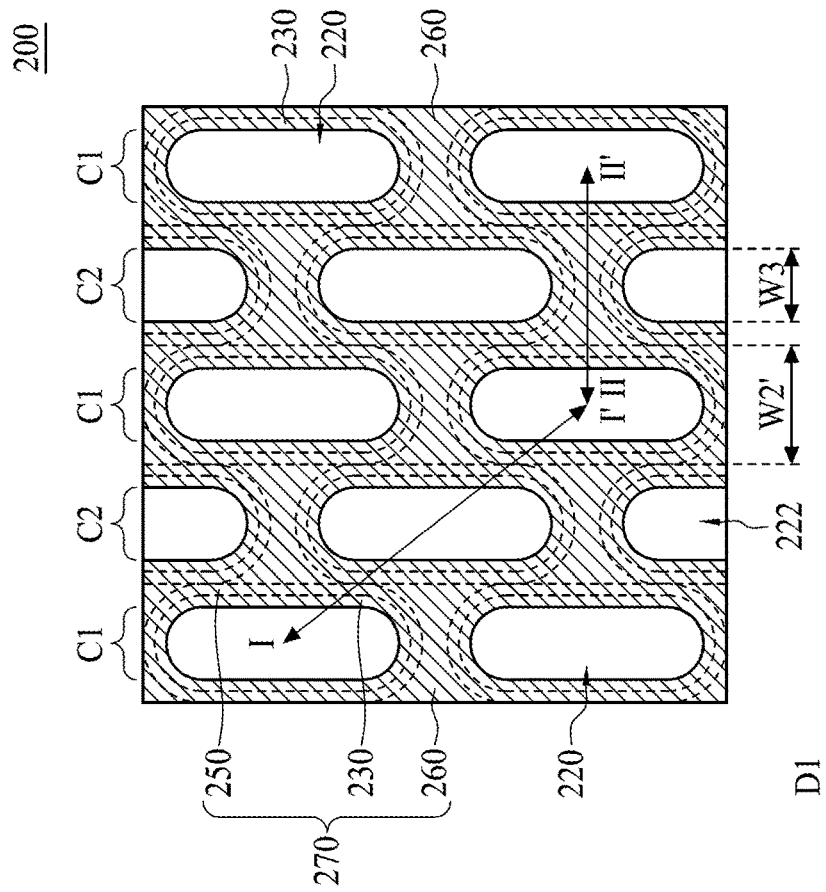
FIG. 7B
FIG. 7A

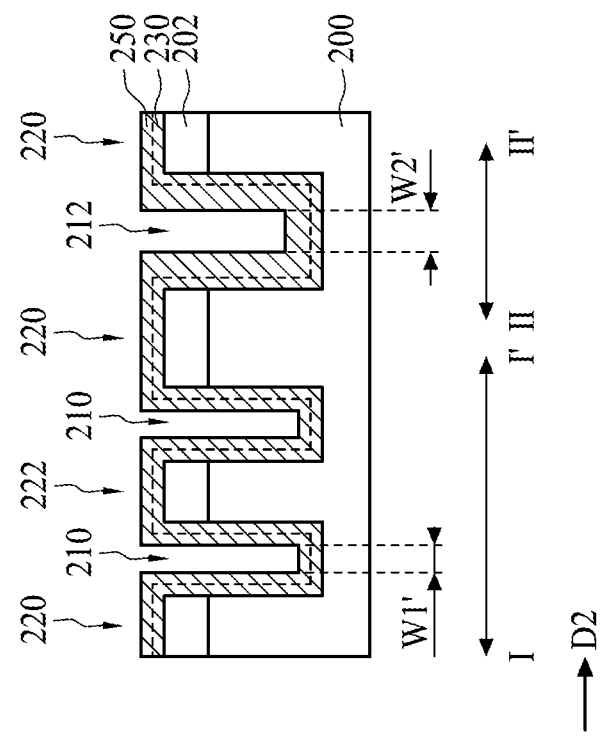
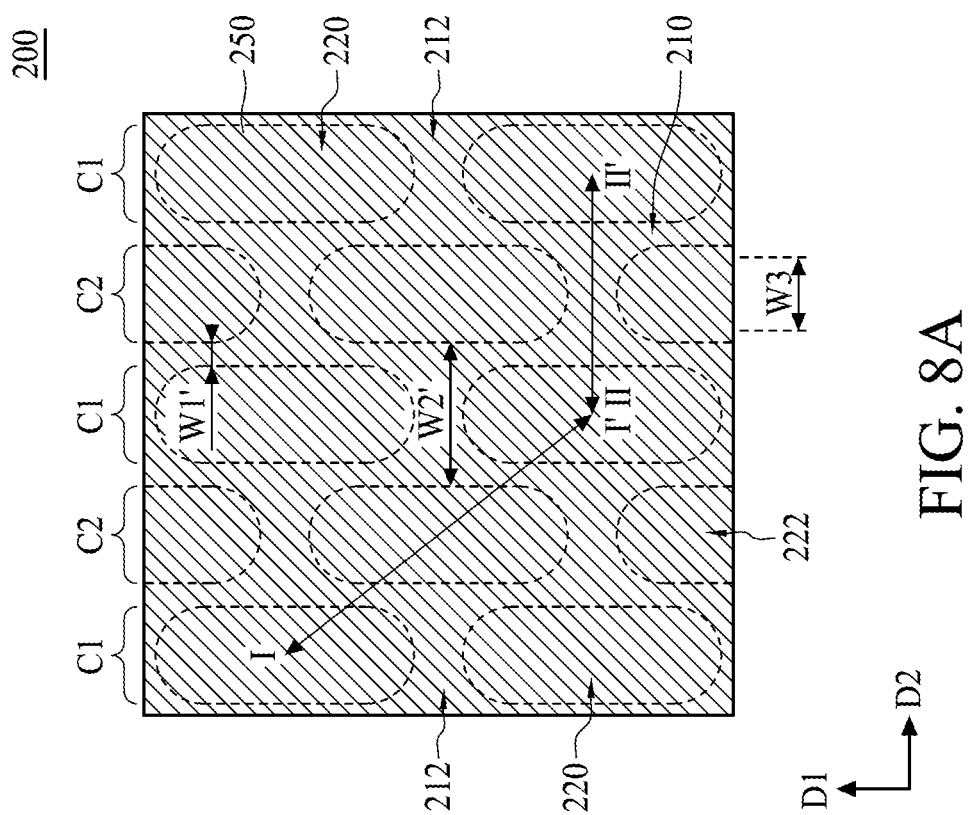
FIG. 8A
FIG. 8B

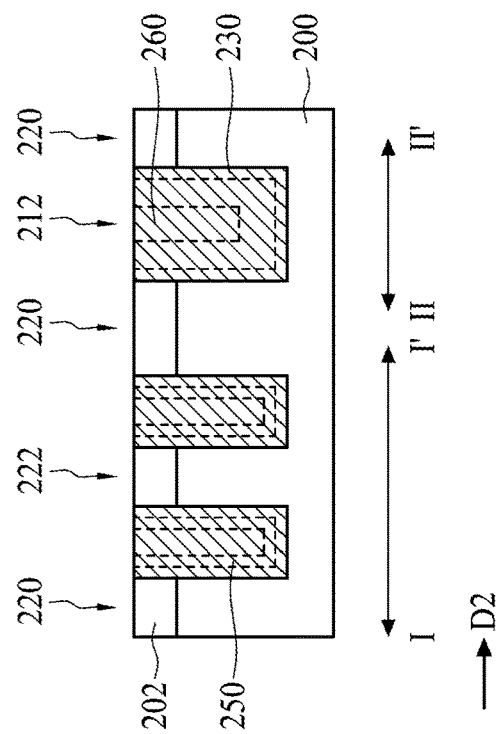
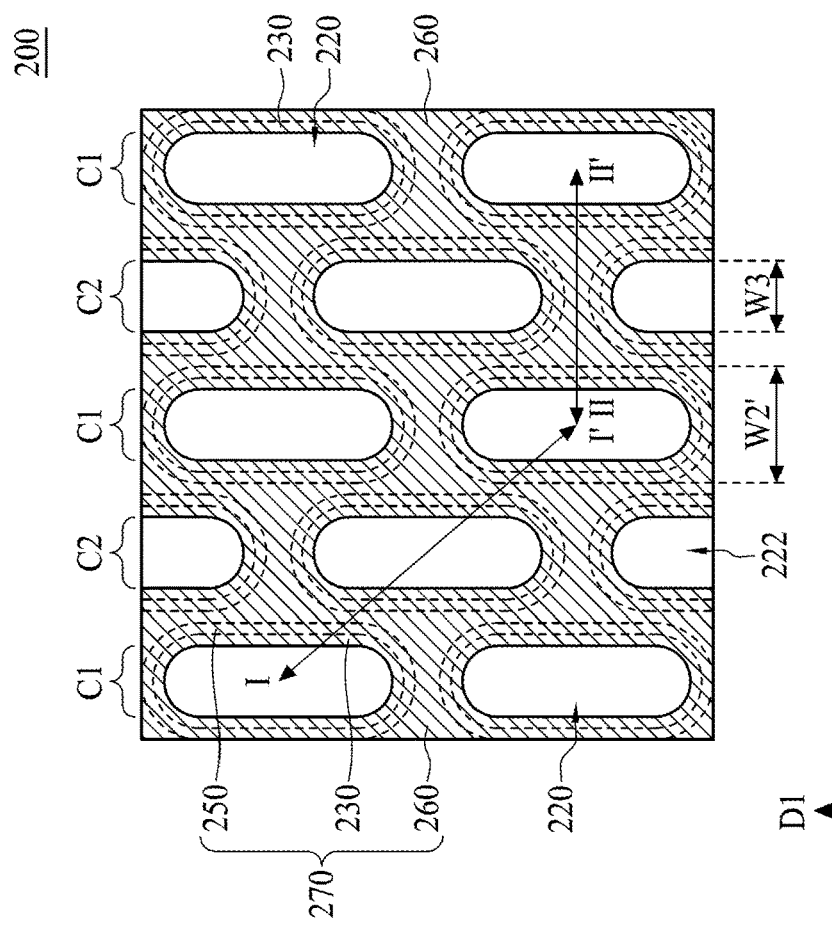
FIG. 10A
FIG. 10B

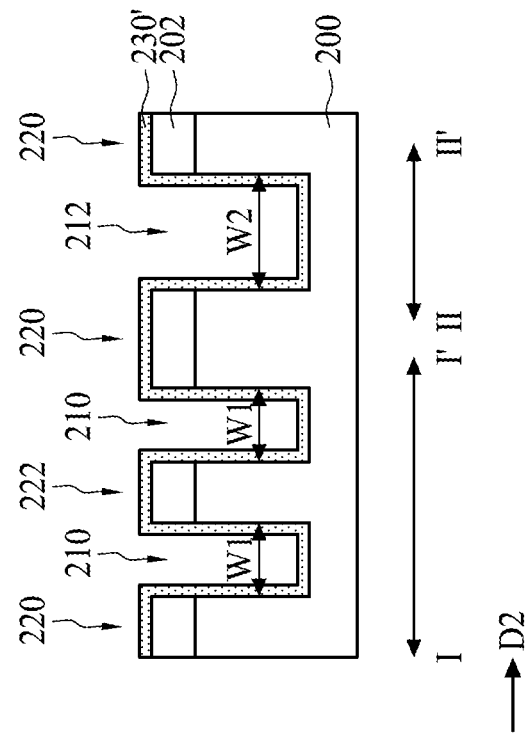
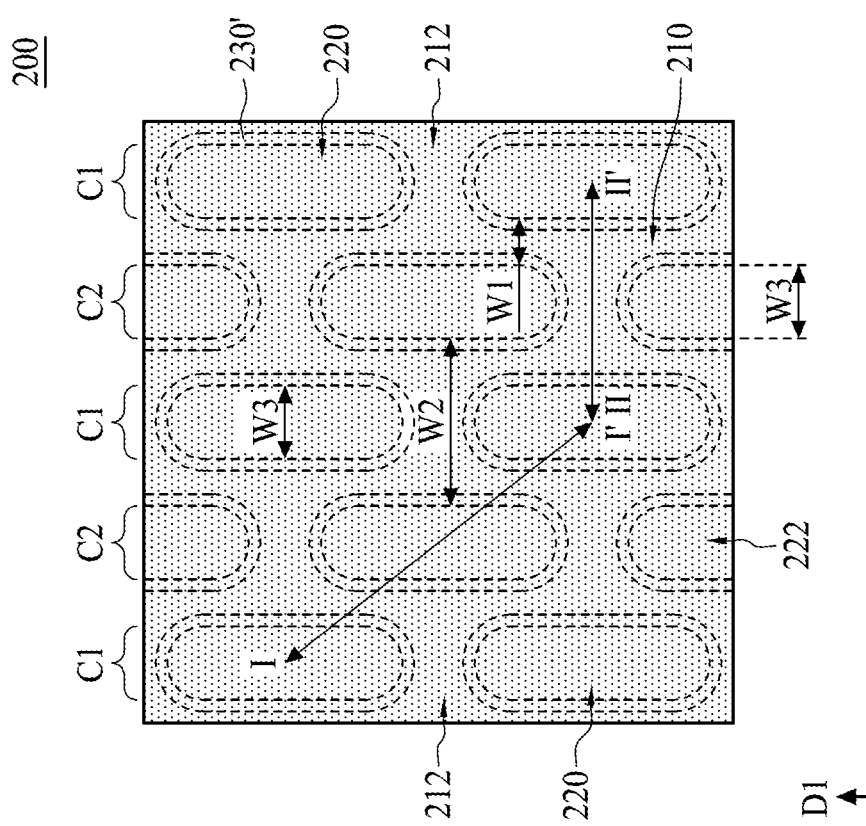
FIG. 11B
FIG. 11A

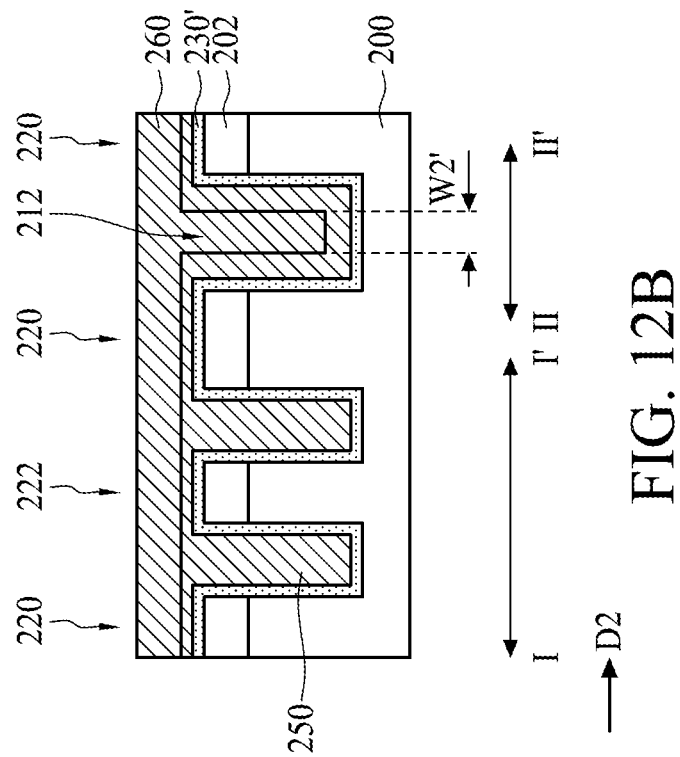
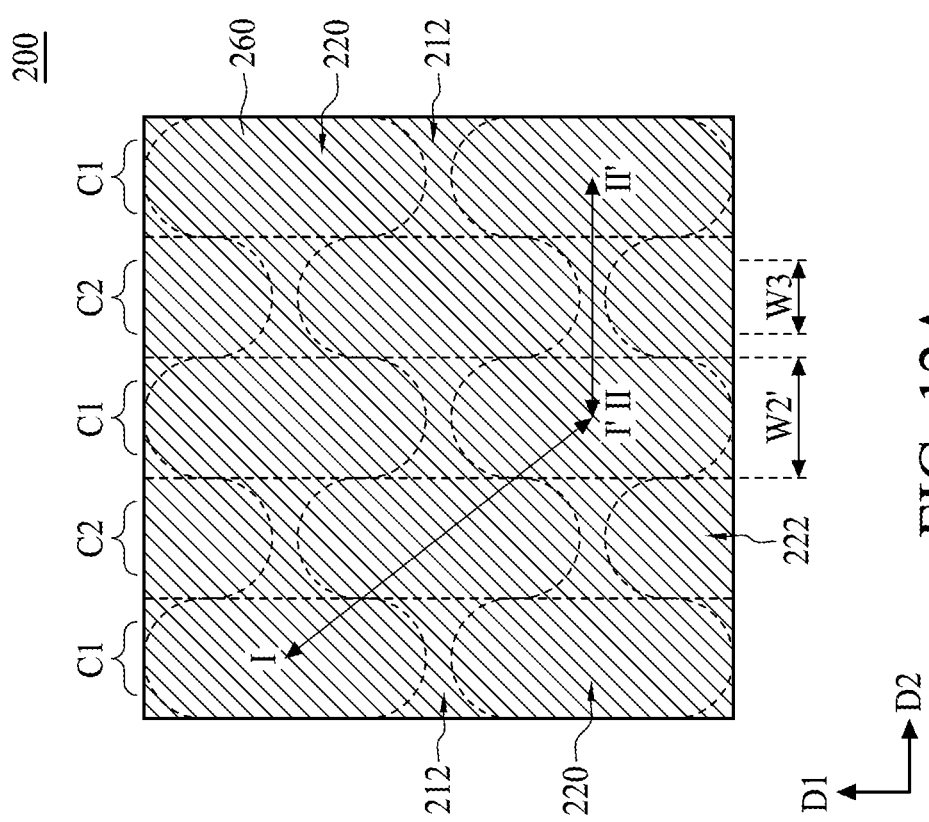
FIG. 12B
FIG. 12A

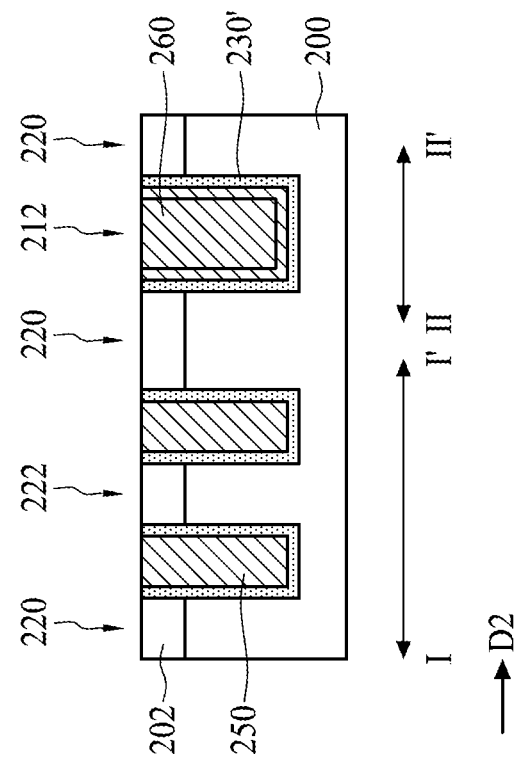
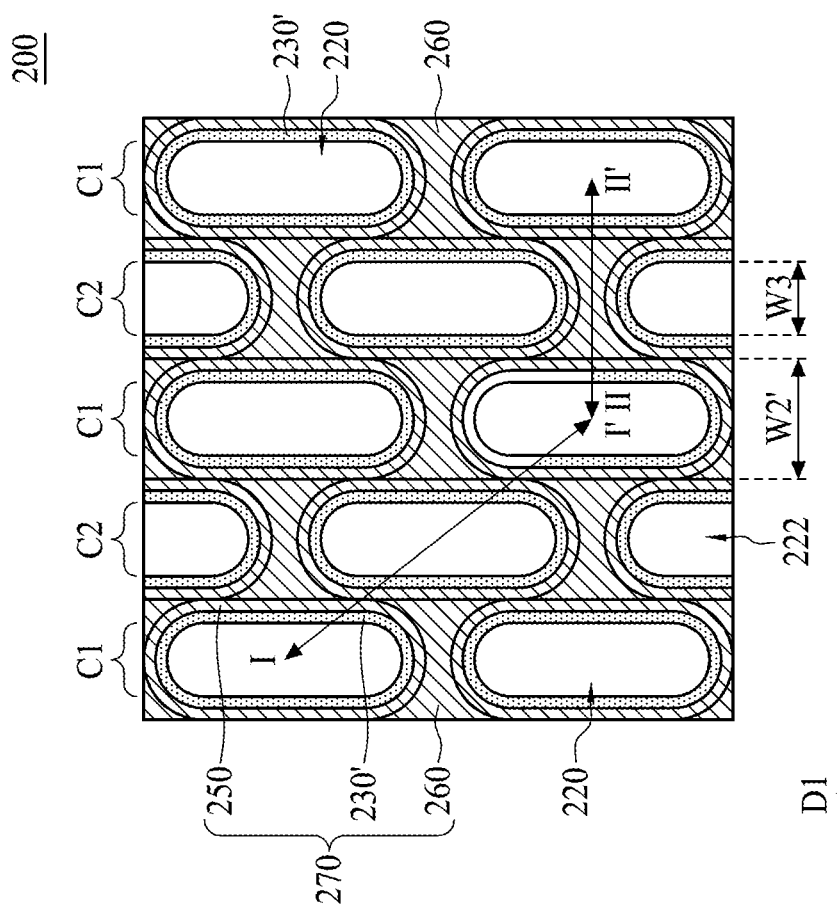
FIG. 13B
FIG. 13A

METHOD FOR PREPARING SEMICONDUCTOR STRUCTURES

TECHNICAL FIELD

The present disclosure relates to a method for preparing semiconductor structures, and more particularly, to a method for preparing semiconductor island structures.

DISCUSSION OF THE BACKGROUND

In semiconductor manufacturing processes, photolithography techniques are commonly adopted to define structures. Typically, an integrated circuit layout is designed and outputted onto one or more photomasks. The integrated circuit layout is transferred from the photomasks to a mask layer to form a mask pattern, and then transferred from the mask pattern to a target layer. However, with the advancing miniaturization and integration requirements of semiconductor devices, including memory devices such as dynamic random access memories (DRAMs), flash memories, static random access memories (SRAMs), and ferroelectric (FE) memories, the semiconductor structures and features of such devices become more miniaturized as well. Accordingly, the continual reduction in semiconductor structure and feature sizes places ever-greater demands on the techniques used to form the structures and features.

For example, to form active regions in the substrate, a plurality of trenches are formed by etching the substrate, and a plurality of island structures, which are used to form the active regions, are obtained and separated from each other by the trenches. Insulating materials are then deposited to fill the trenches and to form a plurality of isolation structures to define and provide electrical isolation between the island structures. However, it is often found that the island structures may collapse due to stress from the insulating material filled therebetween. Consequently, reliability and performance of a device that includes an island structure and an active region are reduced.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a method for preparing semiconductor structures. The method includes the following steps. A substrate is provided. A plurality of first trenches, a plurality of second trenches, a plurality of first island structures and a plurality of second island structures are formed. Each of the first island structures is separated from each of the second island structures by the first trenches. The plurality of first island structures are separated from each other by the second trenches, and the plurality of second island structures are separated from each other by the second trenches. A first dielectric layer is then conformally formed to cover sidewalls and a bottom of each first trench and sidewalls and a bottom of each second trench. A semiconductor layer is formed on the first dielectric layer. An oxidation is performed to convert the semiconductor layer to a semiconductor oxide layer in each of the first trenches and each of the second trenches. A second dielectric layer is then formed to fill the plurality of second trenches.

In some embodiments, the plurality of first island structures are arranged along a first direction to form a plurality of first columns, and the plurality of second island structures are arranged along the first direction to form a plurality of second columns.

In some embodiments, the plurality of first columns and the plurality of second columns are alternately arranged along a second direction different from the first direction.

In some embodiments, the second direction is perpendicular to the first direction.

In some embodiments, the plurality of first trenches and the plurality of second trenches are coupled to each other to form a grid.

In some embodiments, a width of the second trenches is at least three times a width of the first trenches.

In some embodiments, the width of the first trenches is less than 30 nanometers.

In some embodiments, the semiconductor layer includes silicon.

In some embodiments, a thickness of the semiconductor layer is less than 10 nm.

In some embodiments, the semiconductor oxide layer fills each of the first trenches.

In some embodiments, the semiconductor oxide layer is formed in each of the first trenches to reduce a width of each of the first trenches, and formed in each of the second trenches to reduce a width of each of the second trenches.

In some embodiments, the second dielectric layer fills the plurality of first trenches having the reduced width and the plurality of second trenches having the reduced width.

In some embodiments, the second dielectric layer includes a flowable dielectric layer.

In some embodiments, the first dielectric layer and the second dielectric layer include a same material.

In some embodiments, the first dielectric layer and the second dielectric layer include different materials.

In some embodiments, the method further includes a step of performing a planarization after the forming of the second dielectric layer.

In some embodiments, a patterned hard mask is disposed on each of the first island structures and each of the second island structures. In some embodiments, the patterned hard mask is exposed after the performing of the planarization.

In some embodiments, a top surface of the patterned hard mask, topmost portions of the first dielectric layer, and a top surface of the second dielectric layer are coplanar.

In the present disclosure, the semiconductor oxide layer is formed to fill the first trenches, which have a width that is less than those of the second trenches. Subsequently, the second dielectric layer is formed to fill the second trenches. As a result, stress to the first and second island structures next to the first trench, generated by filling the trenches with the second dielectric layer, is reduced. Consequently, collapse of the first and second island structures is mitigated, and thus reliability and performance of a device that includes the first and second island structures are improved.

In contrast, with a comparative method applied without forming the semiconductor oxide layer to fill the first trenches, the dielectric layer used to fill both of the first and second trenches renders stress to the first and second island structures next to the first trenches and the second trenches. Since the width of the first trenches is less than the width of the second trenches, the stresses cause more impact to the first and second island structures next to the first trenches.

Thus, the first or second island structures next to first trenches often collapse, and thus reliability and performance of the device, which includes the first and second island structures, are adversely impacted.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

FIGS. 2A, 3A, 4A, 5A, 6A and 7A are schematic diagrams illustrating various fabrication stages of the method for preparing the semiconductor structures in accordance with a first embodiment of the present disclosure.

FIGS. 2B, 3B, 4B, 5B, 6B and 7B are cross-sectional views taken along line I-I' and line II-IT in FIGS. 2A, 3A, 4A, 5A, 6A and 7A, respectively.

FIGS. 8A, 9A and 10A are schematic diagrams illustrating various fabrication stages of the method for preparing the semiconductor structures in accordance with a second embodiment of the present disclosure.

FIGS. 8B, 9B and 10B are cross-sectional views taken along line I-I' and line II-II' in FIGS. 8A, 9A and 10A, respectively.

FIGS. 11A, 12A and 13A are schematic diagrams illustrating various fabrication stages of the method for preparing the semiconductor structures in accordance with a third embodiment of the present disclosure.

FIGS. 11B, 12B and 13B are cross-sectional views taken along line I-I' and line II-II' in FIGS. 11A, 12A and 13A, respectively.

DETAILED DESCRIPTION

Figure 1:
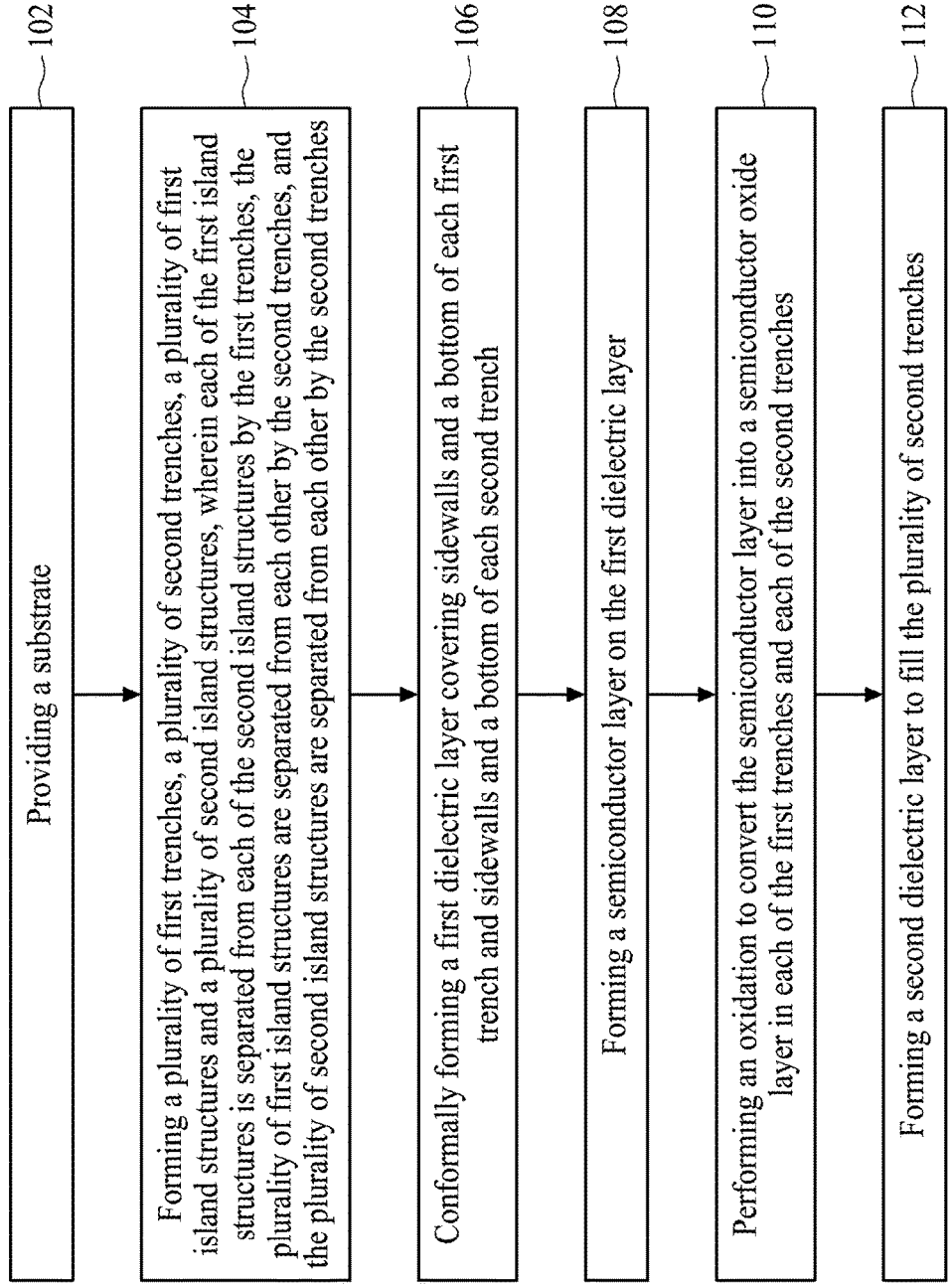
FIG. 1 is a flow diagram illustrating a method for preparing semiconductor structures, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As used herein, the terms "patterning" or "patterned" are used in the present disclosure to describe an operation of forming a predetermined pattern on a surface. The patterning operation includes various steps and processes and varies in accordance with different embodiments. In some embodiments, a patterning process is adopted to pattern an existing film or layer. The patterning process includes forming a mask on the existing film or layer and removing the unmasked film or layer with an etch or other removal process. The mask can be a photoresist or a hard mask. In some embodiments, a patterning process is adopted to form a patterned layer directly on a surface. The patterning process includes forming a photosensitive film on the surface, conducting a photolithography process, and performing a developing process. The remaining photosensitive film is retained and integrated into the semiconductor device.

FIG. 1 is a flow diagram illustrating a method for preparing semiconductor structures, in accordance with some embodiments of the present disclosure. The method for preparing semiconductor structures 10 includes a step 102, providing a substrate. The method for preparing the semiconductor structures 10 further includes a step 104, forming a plurality of first trenches, a plurality of second trenches, a plurality of first island structures and a plurality of second island structures. In some embodiments, each of the first island structures is separated from each of the second island structures by the first trenches. In some embodiments, the first island structures are separated from each other by the second trenches, and the second island structures are separated from each other by the second trenches. The method for preparing the semiconductor structures 10 further includes a step 106, conformally forming a first dielectric layer covering sidewalls and a bottom of each first trench and sidewalls and a bottom of each second trench. The method for preparing the semiconductor structures 10 further includes a step 108, forming a semiconductor layer on the first dielectric layer. The method for preparing the semiconductor structures 10 further includes a step 110, performing an oxidation to covert the semiconductor layer into a semiconductor oxide layer in each of the first trenches and each of the second trenches. The method for preparing the semiconductor structures 10 further includes a step 112, forming a second dielectric layer to fill the plurality of second trenches. The method for preparing the semiconductor structures 10 will be further described according to one or more embodiments.

Figure 2B:
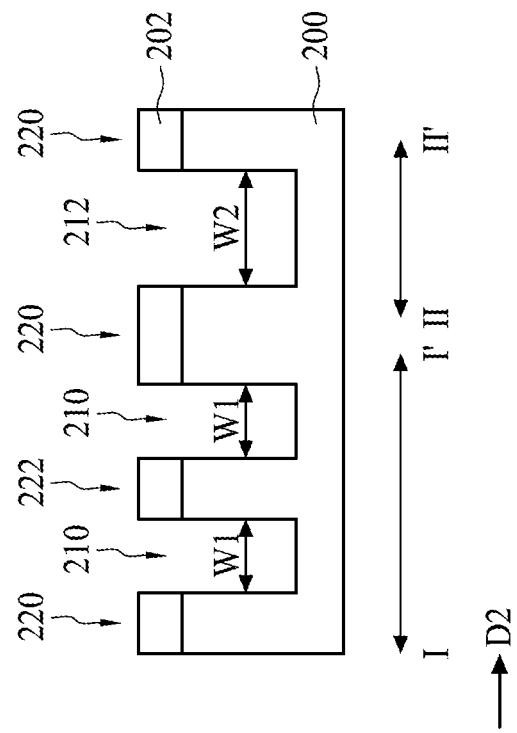
Figure 2A:
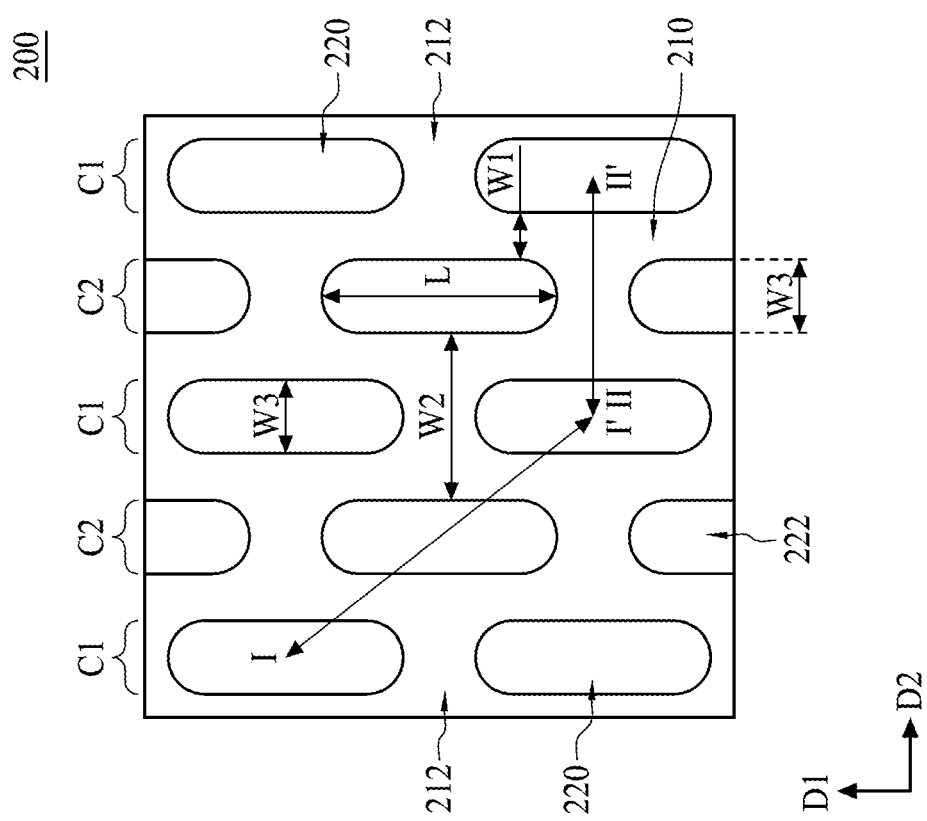

FIGS. 2A, 3A, 4A, 5A, 6A and 7A are schematic diagrams illustrating various fabrication stages constructed according to the method for preparing the semiconductor structures in accordance with a first embodiment of the present disclosure, and FIGS. 2B, 3B, 4B, 5B, 6B and 7B are cross-sectional views taken along line I-I' and line II-II' in FIGS. 2A, 3A, 4A, 5A, 6A and 7A, respectively. Referring to FIGS. 2A and 2B, a substrate 200 is provided according to step 102. The substrate 200 can include silicon (Si), gallium (Ga), gallium arsenide (GaAs), gallium nitride (GaN), strained silicon, silicon-germanium (SiGe), silicon carbide (SiC), diamond, epitaxy layer or a combination thereof, but the disclosure is not limited thereto.

Referring to FIGS. 2A and 2B, a patterned hard mask 202 is formed on the substrate 200. In some embodiments of the present disclosure, the patterned hard mask 202 can include a single-layer or multi-layered structure. In some embodiments, the patterned hard mask 202 can be formed by the following steps. A pad oxide layer (not shown) is formed over the substrate 200. Next, a pad nitride layer (not shown) is formed. The pad oxide layer reduces stress on the substrate 202 from the pad nitride layer. Next, a patterned photoresist layer (not shown) defining an isolation structure is formed on the pad nitride layer. Portions of hard mask are removed through the patterned photoresist layer, thus forming the patterned hard mask 202. Next, portions of the substrate 200 are removed through the patterned hard mask 202, and thus a plurality of first trenches 210 and a plurality of second trenches 212 are formed, as shown in FIGS. 2A and 2B. In some embodiments, the first trenches 210 and the second trenches 212 have a same depth, but the disclosure is not limited thereto. In some embodiments, a width W2 of the second trenches 212 is greater than a width W1 of the first trenches 210, as shown in FIGS. 2A and 2B. In some embodiments, the width W2 of the second trenches 212 is at least three times the width W1 of the first trenches 210, but the disclosure is not limited thereto. In some embodiments, the width W1 of the first trenches 210 is less than 30 nm, but the disclosure is not limited thereto. Further, as shown in FIG. 2A, the first trenches 210 and the second trenches 212 are coupled to each other to form a grid.

Still referring to FIGS. 2A and 2B, the grid formed by the first trenches 210 and the second trenches 212 further defines a plurality of first island structures 220 and a plurality of second island structures 222. In other words, the plurality of first trenches 210, the plurality of second trenches 212, the plurality of first island structures 220 and the plurality of second island structures 222 are simultaneously formed according to step 104. The first island structures 220 and the second island structures 222 include a same length L and a same width W3. In some embodiments, the width W3 of the first island structures 220 and the second island structures 222 can be equal to or greater than the width W1 of the first trenches 210, but less than the width W2 of the second trenches 212. As shown in FIG. 2A, the first island structures 220 are arranged along a first direction D1 to form a plurality of first columns C1, and the second island structures 222 are arranged along the first direction D1 to form a plurality of second columns C2. It should be noted that the first columns C1 and the second columns C2 are alternately arranged along a second direction D2, and the second direction D2 is different from the first direction D1. In some embodiments, the second direction D2 is perpendicular to the first direction D1, but the disclosure is not limited thereto. As shown in FIGS. 2A and 2B, along the second direction D2, the first island structures 220 and the second island structures 222 are alternately arranged, but the first island structures 220 and the adjacent second island structures 220 are not aligned. More importantly, each of the first island structures 220 is separated from each of the second island structures 222 by the first trenches 210 while the first island structures 220 are separated from each other by the second trenches 212 and the second island structures 222 are separated from each other by the second trenches 212, as shown in FIGS. 2A and 2B.

Figure 3B:
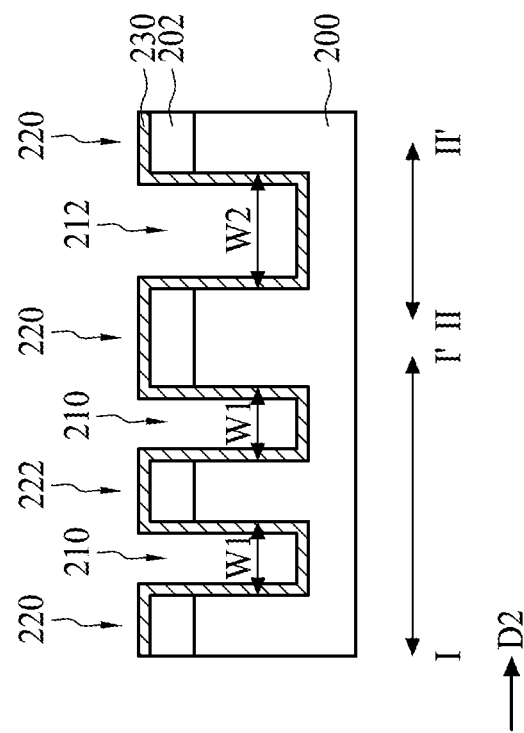
Figure 3A:
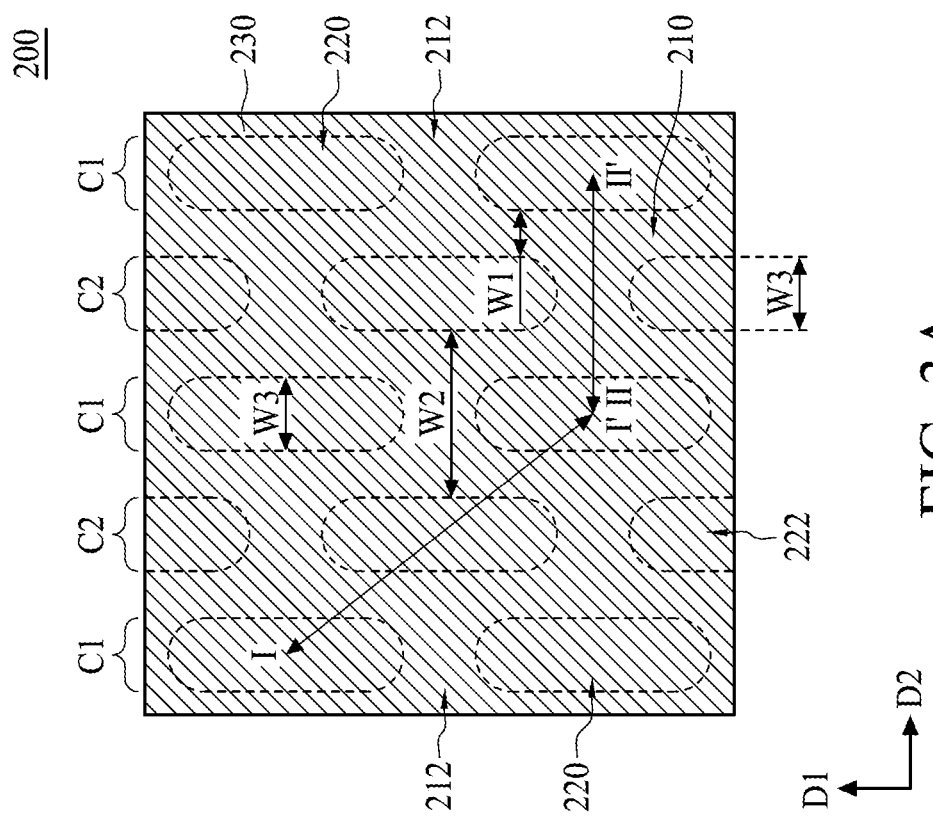

Referring to FIGS. 3A and 3B, a first dielectric layer 230 is formed according to step 106. According to step 106, the first dielectric layer 230 is conformally formed to cover sidewalls and a bottom of each first trench 210 and sidewalls and a bottom of each second trench 212. In some embodiments, the first dielectric layer 230 can include silicon oxide (SiO), but the disclosure is not limited thereto.

Figure 4B:
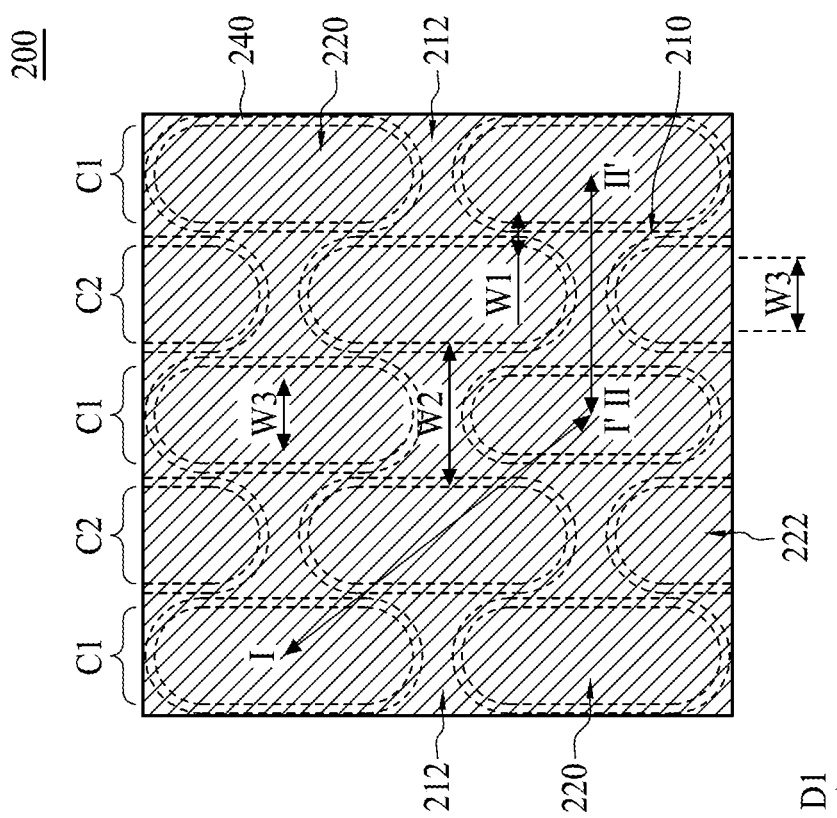
Figure 4A:
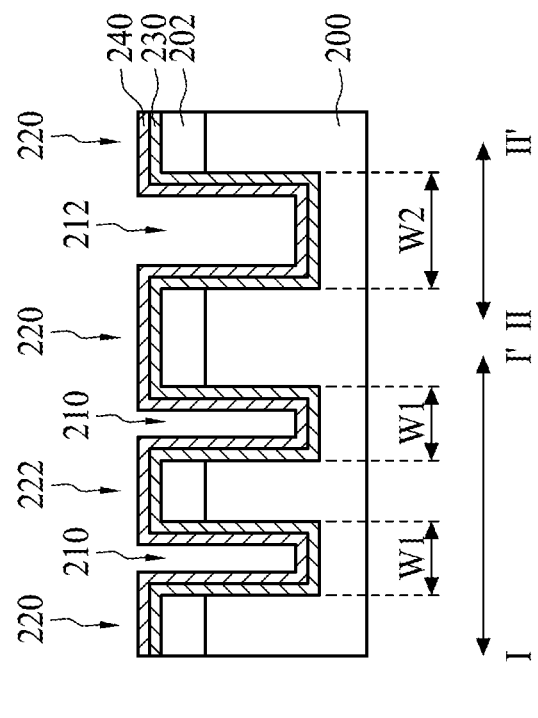

Referring to FIGS. 4A and 4B, a semiconductor layer 240 is next formed on the first dielectric layer 230, according to step 108. In some embodiments, the semiconductor layer 240 includes silicon, but the disclosure is not limited thereto. In some embodiments, a thickness of the semiconductor layer 240 is less than 10 nm, but the disclosure is not limited thereto.

Figure 5B:
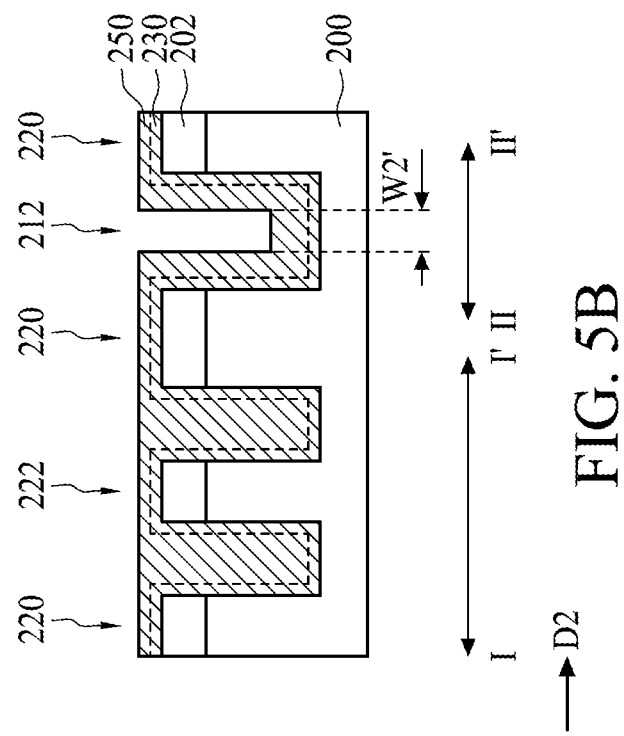
Figure 5A:
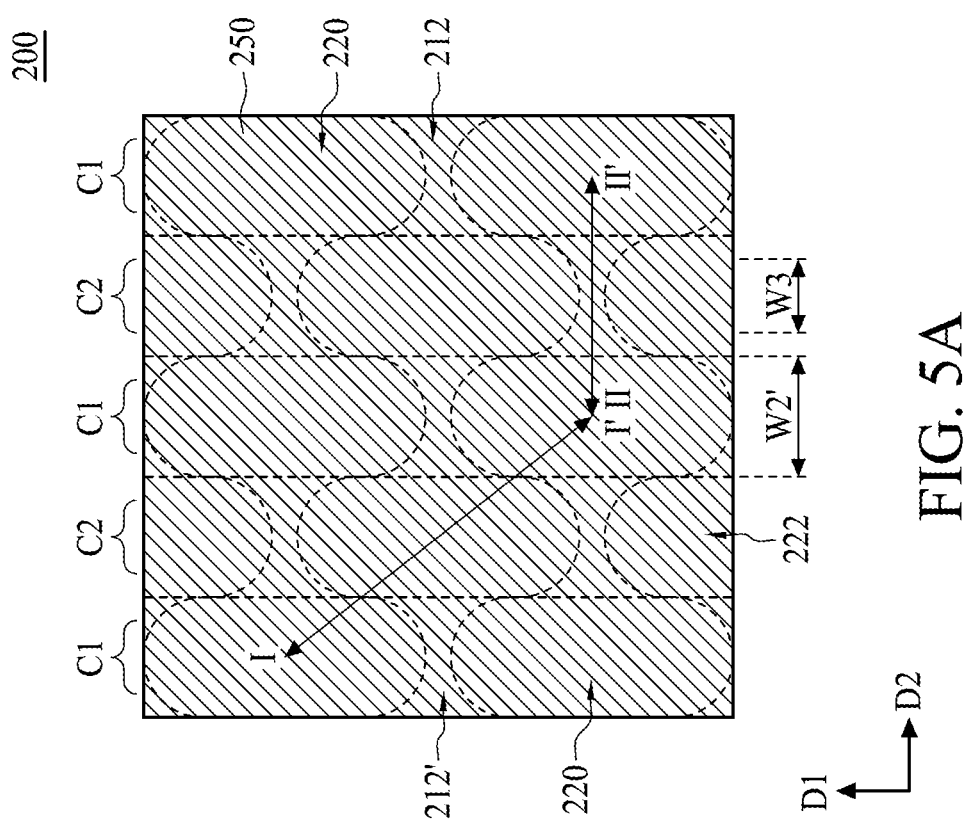

Referring to FIGS. 5A and 5B, an oxidation is performed according to step 110. In some embodiments, the oxidation can be a thermal oxidation, but the disclosure is not limited thereto. According to step 110, the semiconductor layer 240 is oxidized and converted into a semiconductor oxide layer 250, such as a SiO layer, in each of the first trenches 210 and each of the second trenches 212, but the disclosure is not limited thereto. It should be noted that a thickness of the semiconductor oxide layer 250 is greater than the thickness of the semiconductor layer 240 due to the introduction of oxygen; therefore, in some embodiments, each of the first trenches 210 is filled with the semiconductor oxide layer 250. Unlike the first trenches 210, the width W2 of the second trenches 212 is reduced to a width W2' due to the thicker semiconductor oxide layer 250. However, the width W2' of the second trenches 212 after the forming of the semiconductor oxide layer 250 is greater than zero. Additionally, during the performing of the oxidation, the first dielectric layer 230 renders protection to the substrate 200 below the dielectric layer 230, such that no oxidation or consumption of the substrate 200 is incurred.

Referring to FIGS. 6A and 6B, a second dielectric layer 260 is formed on the substrate 200 according to step 112. In some embodiments, the second dielectric layer 260 includes a flowable dielectric material that is advantageous to fill the gaps or trenches. The flowable dielectric material can be deposited to substantially fill high aspect ratio gaps or trenches without leaving voids. In some embodiments, the flowable dielectric material can include flowable oxide, silane oxide, and spin-on glass (SOG), but the disclosure is not limited thereto. The flowable dielectric material is applied in liquid form and flows into the second trenches 212 that have the reduced width W2'. A hardening process is then performed such that the flowable dielectric material is transformed from the liquid form to a solid form, and thus the second dielectric layer 260 is obtained. Consequently, the second trenches 212 are filled with the second dielectric layer 260, as shown in FIG. 6B. Additionally, in some embodiments, the first dielectric layer 230 and the second dielectric layer 260 can include the same material, such as SiO, but the disclosure is not limited thereto. Accordingly, the first trenches 210 are filled with the semiconductor oxide layer 250 while the second trenches 212 are filled with second dielectric layer 260. In some embodiments, the semiconductor oxide layer 250 and the second dielectric layer 260 can include the same material, such as SiO. In some embodiments, the first dielectric layer 230, the semiconductor oxide layer 250 and the second dielectric layer 260 all include the same material, such as SiO, but the disclosure is not limited thereto.

Referring to FIGS. 7A and 7B, in some embodiments, a planarization such as chemical mechanical planarization (CMP) is performed after the forming of the second dielectric layer 260. Accordingly, a portion of the second dielectric layer 260, a portion of the semiconductor oxide layer 250 and a portion of the first dielectric layer 230 are removed from the substrate 200. As a result, the patterned hard mask 202 on the first and second island structures 220 and 222 is exposed, and the first dielectric layer 230, the semiconductor oxide layer 250 and the second dielectric layer 260 between the first and second island structures 220 and 222 are exposed. In some embodiments, a top surface of the patterned hard mask 202, topmost portions of the first dielectric layer 230, a top surface of the semiconductor oxide layer 250 and a top surface of the second dielectric layer 260 are coplanar, but the disclosure is not limited thereto. Further, an isolation structure 270 that includes the first dielectric layer 230, the semiconductor oxide layer 250 and the second dielectric layer 250 is obtained between the first and second island structures 220 and 222.

According to the method 10, the first trenches 210 are filled with the semiconductor oxide layer 250, and therefore the filling of the second trenches 212 with the second dielectric layer 260 has no effect on the first trenches 210. Accordingly, stresses generated during the filling of the second trenches 212 and the hardening of the second dielectric layer 260 have no effect on the first and second island structures 220 and 222 next to the first trenches 210. Therefore, collapse issue is mitigated and reliability and performance of the devices that include the first and second island structures 220 and 222 are improved.

Figure 9B:
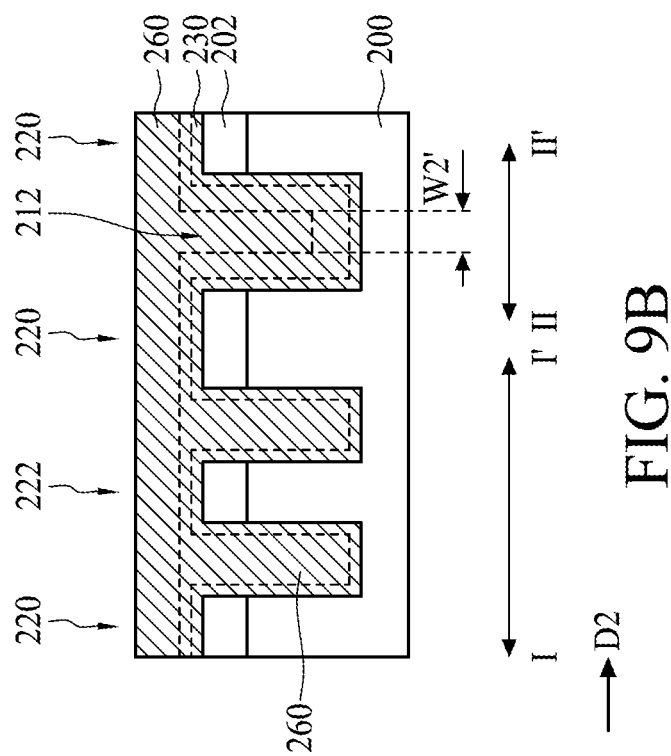
Figure 9A:
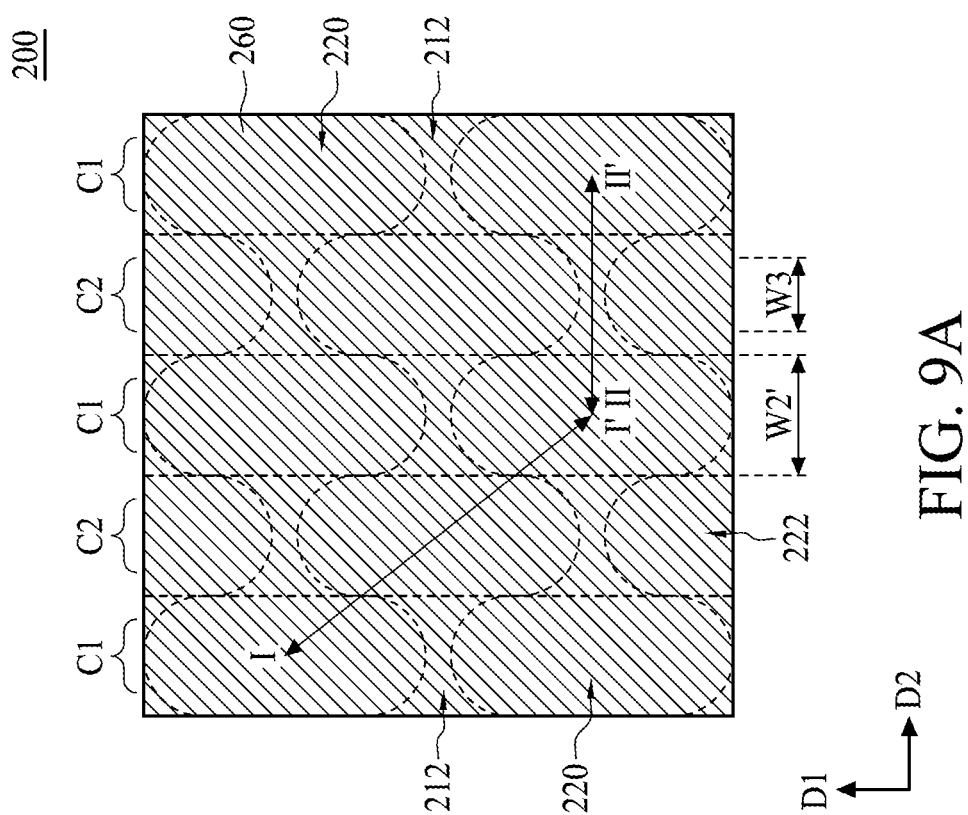

FIGS. 8A, 9A and 10A are schematic diagrams illustrating various fabrication stages constructed according to the method for preparing the semiconductor structures in accordance with a second embodiment of the present disclosure, and FIGS. 8B, 9B and 10B are cross-sectional views taken along line I-I' and line II-IT in FIGS. 8A, 9A and 10A, respectively. It should be understood that similar features in the first and second embodiments are identified by the same reference numerals for clarity and simplicity. Furthermore, similar elements in the first and second embodiments can include similar materials, and thus such details are omitted in the interest of brevity. Referring to FIGS. 8A and 8B, a substrate 200 is provided according to step 102. A patterned hard mask 202 is formed on the substrate 200. Next, portions of the substrate 200 are removed through the patterned hard mask 202, and thus a plurality of first trenches 210 and a plurality of second trenches 212 are formed, as shown in FIGS. 8A and 8B. In some embodiments, the first trenches 210 and the second trenches 212 have a same depth, but the disclosure is not limited thereto. In some embodiments, a width W1 of the first trenches 210 can be the same as the width of other first trenches 210 described above and a width W2 of the second trenches 212 can be the same as the width of other second trenches 212 described above, and therefore such details are omitted for brevity. Further, as shown in FIGS. 8A and 8B, the first trenches 210 and the second trenches 212 are coupled to each other to form a grid.

Still referring to FIGS. 8A and 8B, the grid formed by the first trenches 210 and the second trenches 212 further defines a plurality of first island structures 220 and a plurality of second island structures 222. In other words, the plurality of first trenches 210, the plurality of second trenches 212, the plurality of first island structures 220 and the plurality of second island structures 222 are simultaneously formed according to step 104. A width W3 of the first and second structures 220 and 222 can be the same as the width of other first and second structures 220 and 222 described above, and therefore such details are omitted for brevity. Further, arrangements of the first and second structures 220 and 222 can be the same as arrangements of other first and second structures 220 and 222 described above, and therefore such details are also omitted for brevity.

Still referring to FIGS. 8A and 8B, a first dielectric layer 230 is formed according to step 106. According to step 106, the first dielectric layer 230 is conformally formed to cover sidewalls and a bottom of each first trench 210 and sidewalls and a bottom of each second trench 212. In some embodiments, the first dielectric layer 230 can include SiO, but the disclosure is not limited thereto. Next, a semiconductor layer 240 is formed on the first dielectric layer 230, according to step 108. In some embodiments, the semiconductor layer 240 includes silicon, but the disclosure is not limited thereto. In some embodiments, a thickness of the semiconductor layer 240 is less than 10 nm, but the disclosure is not limited thereto.

Referring to FIGS. 8A and 8B, an oxidation is performed according to step 110. In some embodiments, the oxidation can be a thermal oxidation, but the disclosure is not limited thereto. According to step 110, the semiconductor layer 240 is oxidized and converted into a semiconductor oxide layer 250, such as a SiO layer, in each of the first trenches 210 and each of the second trenches 212, but the disclosure is not limited thereto. It should be noted that in some embodiments, the semiconductor oxide layer 250 covers the sidewalls and the bottoms of the first and second trenches 210 and 212 without filling the trenches. Therefore, the width W1 of the first trenches 210 is reduced and the width W2 of the second trenches 212 is reduced. As shown in FIGS. 8A and 8B, the first trenches 210 include a reduced width W1' and the second trenches 212 include a reduced width W2'. In some embodiments, both the reduced width W2' of the second trenches 212 and the reduced width W1' of the first trenches 210 are greater than zero. Additionally, during the performing of the oxidation, the first dielectric layer 230 renders protection to the substrate 200 below the first dielectric layer 230, such that no oxidation or consumption of the substrate 200 will be incurred.

Referring to FIGS. 9A and 9B, a second dielectric layer 260 is formed on the substrate 200 according to step 112. In some embodiments, the second dielectric layer 260 includes a flowable dielectric material that is advantageous to fill the gaps or trenches. As mentioned above, the flowable dielectric material can be deposited to substantially fill high aspect ratio gaps or trenches without leaving voids. In some embodiments, the flowable dielectric material is applied in liquid form and flows into the first trenches 210 and the second trenches 212. A hardening process is then performed such that the flowable dielectric material is transformed from the liquid form to a solid form, and thus the second dielectric layer 260 is formed to fill the first trenches 210 and the second trenches 212, as shown in FIG. 9B. Additionally, in some embodiments, the first dielectric layer 230 and the second dielectric layer 260 can include the same material, such as SiO, but the disclosure is not limited thereto. In some embodiments, the first dielectric layer 230, the semiconductor oxide layer 250 and the second dielectric layer 260 all include the same material, such as SiO, but the disclosure is not limited thereto.

Referring to FIGS. 10A and 10B, in some embodiments, a planarization is performed after the forming of the second dielectric layer 260. Accordingly, the patterned hard mask 202 on the first and second island structures 220 and 222 is exposed while the first dielectric layer 230, the semiconductor oxide layer 250 and second dielectric layer 260 between the first and second island structures 220 and 222 are exposed. In some embodiments, a top surface of the patterned hard mask 202, topmost portions of the first dielectric layer 230, top portions of the semiconductor oxide layer 250 and a top surface of the second dielectric layer 260 are coplanar, but the disclosure is not limited thereto. Further, an isolation structure 270 including the first dielectric layer 230, the semiconductor oxide layer 250 and the second dielectric layer 250 is obtained between the first and second island structures 220 and 222.

According to the method 10, the first trenches 210 and the second trenches 212 are filled with the second dielectric layer 260. However, the first dielectric layer 230 and the semiconductor oxide layer 250 serve as reinforcements, so that stresses generated during the filling of the first and second trenches 210 and 212 with the flowable dielectric material, and during the hardening of the flowable dielectric material, are buffered. Accordingly, collapse issue of the first and second island structures 220 and 222 is mitigated and reliability and performance of the devices that include the first and second island structures 220 and 222 are improved.

FIGS. 11A, 12A and 13A are schematic diagrams illustrating various fabrication stages constructed according to the method for preparing the semiconductor structures in accordance with a third embodiment of the present disclosure, and FIGS. 11B, 12B and 13B are cross-sectional views taken along line I-I' and line II-II' in FIGS. 11A, 12A and 13A, respectively. It should be understood that similar features in the first and third embodiments are identified by the same reference numerals for clarity and simplicity. Furthermore, similar elements in the first and second embodiments can include similar materials, and thus such details are omitted in the interest of brevity. Referring to FIGS. 11A and 11B, a substrate 200 is provided according to step 102. A patterned hard mask 202 is formed on the substrate 200. Next, portions of the substrate 200 are removed through the patterned hard mask 202, and thus a plurality of first trenches 210 and a plurality of second trenches 212 are formed, as shown in FIGS. 11A and 11B. In some embodiments, the first trenches 210 and the second trenches 212 have a same depth, but the disclosure is not limited thereto. In some embodiments, a width W1 of the first trenches 210 can be the same as a width of other first trenches described above, and a width W2 of the second trenches 212 can be the same as a width of other second trenches described above, and therefore such details are omitted for brevity. Further, as shown in FIG. 11A, the first trenches 210 and the second trenches 212 are coupled to each other to form a grid.

Still referring to FIGS. 11A and 11B, the grid formed by the first trenches 210 and the second trenches 212 further defines a plurality of first island structures 220 and a plurality of second island structures 222. In other words, the plurality of first trenches 210, the plurality of second trenches 212, the plurality of first island structures 220 and the plurality of second island structures 222 are simultaneously formed according to step 104. A length L and a width W3 of the first and second structures 220 and 222 can be the same as the length L and the width W3 of other first and second structures described above, and therefore such details are omitted for brevity. Further, arrangements of the first and second structures 220 and 222 can be the same as arrangements of other first and second structures 220 and 222 described above, and therefore such details are also omitted for brevity. Next, a first dielectric layer 230' is formed on the substrate 200 according to step 106. According to step 106, the first dielectric layer 230 is conformally formed to cover sidewalls and a bottom of each first trench 210 and sidewalls and a bottom of each second trench 212. In some embodiments, the first dielectric layer 230 can include silicon nitride (SiN), silicon oxynitride (SiON) or silicon carbon nitride (SiCN), but the disclosure is not limited thereto.

Referring to FIGS. 12A and 12B, a semiconductor layer 240 is next formed on the first dielectric layer 230, according to step 108. In some embodiments, the semiconductor layer includes silicon, but the disclosure is not limited thereto. In some embodiments, a thickness of the semiconductor layer is less than 10 nm, but the disclosure is not limited thereto. Subsequently, an oxidation is performed according to step 110. In some embodiments, the oxidation can be a thermal oxidation, but the disclosure is not limited thereto. According to step 110, the semiconductor layer 240 is oxidized and converted into a semiconductor oxide layer 250, such as a SiO layer, in each of the first trenches 210 and each of the second trenches 212, but the disclosure is not limited thereto. In some embodiments, the semiconductor oxide layer 250 fills the first trenches 210 and covers the sidewalls and the bottoms of the second trenches 212, as shown in FIG. 12B. However, in other embodiments, the semiconductor oxide layer 250 covers the sidewalls and the bottoms of the first and second trenches 210 and 212. In the latter embodiments, a width W1 of the first trenches 210 is reduced to a reduced width W1', and a width W2 of the second trenches 212 is reduced to a reduced width W2', due to the thicker semiconductor oxide layer 250. Additionally, during the performing of the oxidation, the first dielectric layer 230 renders protection to the substrate 200 below the first dielectric layer 230, such that no oxidation or consumption to the substrate 200 will be incurred.

Still referring to FIGS. 12A and 12B, a second dielectric layer 260 is formed on the substrate 200 according to step 112. In some embodiments, the second dielectric layer 260 includes a flowable dielectric material that is advantageous to fill the gaps or trenches. As mentioned above, the flowable dielectric material can be deposited to substantially fill high aspect ratio gaps or trenches without leaving voids. In some embodiments, the flowable dielectric material is applied in liquid form and flows into the second trenches 212 (and, in some embodiments, the first trenches 210 as well). A hardening process is then performed such that the flowable dielectric material is transformed from the liquid form to a solid form, and thus the second dielectric layer 260 is formed to fill the second trenches 212 (and, in some embodiments, the first trenches 210), as shown in FIG. 12B. Additionally, in some embodiments, the first dielectric layer 230' and the second dielectric layer 260 can include different materials. For example, the first dielectric layer 230' includes SiN, SiON or SiCN while the second dielectric layer 260 includes SiO, but the disclosure is not limited thereto.

Referring to FIGS. 13A and 13B, in some embodiments, a planarization is performed after the forming of the second dielectric layer 260. Accordingly, the patterned hard mask 202, the first dielectric layer 230, the semiconductor oxide layer 250 and the second dielectric layer 260 are exposed. In some embodiments, a top surface of the patterned hard mask 202, topmost portions of the first dielectric layer 230', top portions of the semiconductor oxide layer 250 and a top surface of the second dielectric layer 260 are coplanar, but the disclosure is not limited thereto. Further, an isolation structure 270 including the first dielectric layer 230', the semiconductor oxide layer 250 and the second dielectric layer 250 is obtained between the first and second island structures 220 and 222.

In the present disclosure, the semiconductor oxide layer 250 is formed to fill the first trenches 210, which have a width that is less than that of the second trenches 212. Subsequently, the second dielectric layer 260 is formed to fill the second trenches 212. As a result, stress to the first and second island structures 220 and 222 next to the first trench 210, generated by filling the second trenches 212 with the second dielectric layer 260, is reduced. Consequently, collapse issue of the first and second island structures 220 and 222 is mitigated, and reliability and performance of the device that includes the first and second island structures 220 and 222 are improved.

In contrast, with a comparative method applied without forming the semiconductor oxide layer filling the first trenches having less width, the dielectric layer used to fill both of the first and second trenches causes stress to the first and second island structures next to the first trenches and the second trenches. Since the width of the first trenches is less than the second trenches, the stresses cause more impact to the first and second island structures next to the first trenches. Thus, the first and second island structures next to first trenches often collapse, and thus reliability and performance of the semiconductor device are adversely impacted.

One aspect of the present disclosure provides a method for preparing semiconductor structures. The method includes the following steps: A substrate is provided. A plurality of first trenches, a plurality of second trenches, a plurality of first island structures and a plurality of second island structures are formed. Each of the first island structures is separated from each of the second island structures by the first trenches. The plurality of first island structures are separated from each other by the second trenches, and the plurality of second island structures are separated from each other by the second trenches. A first dielectric layer is then conformally formed to cover sidewalls and a bottom of each first trench and sidewalls and a bottom of each second trench. A semiconductor layer is formed on the first dielectric layer. An oxidation is performed to convert the semiconductor layer into a semiconductor oxide layer in each of the first trenches and each of the second trenches. A second dielectric layer is then formed to fill the plurality of second trenches.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for preparing semiconductor structures, comprising:
   providing a substrate;
   forming a plurality of first trenches, a plurality of second trenches of a different width than that of the plurality of first trenches, a plurality of first island structures and a plurality of second island structures of a different width than that of the plurality of first island structures, wherein each of the first island structures is separated from each of the second island structures by the first trenches, the plurality of first island structures are separated from each other by the second trenches, and the plurality of second island structures are separated from each other by the second trenches;
   conformally forming a first dielectric layer covering sidewalls and a bottom of each first trench and sidewalls and a bottom of each second trench;
   forming a semiconductor layer on the first dielectric layer;
   performing an oxidation to convert the semiconductor layer into a semiconductor oxide layer in each of the first trenches and each of the second trenches; and
   forming a second dielectric layer to fill the plurality of second trenches.

2. The method of claim 1, wherein the plurality of first island structures are arranged along a first direction to form a plurality of first columns, and the plurality of second island structures are arranged along the first direction to form a plurality of second columns.

3. The method of claim 2, wherein the plurality of first columns and the plurality of second columns are alternately arranged along a second direction different from the first direction.

4. The method of claim 3, wherein the second direction is perpendicular to the first direction.

5. The method of claim 1, wherein the plurality of first trenches and the plurality of second trenches are coupled to each other to form a grid.

6. The method of claim 1, wherein a width of the second trenches is at least three times a width of the first trenches.

7. The method of claim 6, wherein the width of the first trenches is less than 30 nm.

8. The method of claim 1, wherein the semiconductor layer comprises silicon.

9. The method of claim 1, wherein a thickness of the semiconductor layer is less than 10 nm.

10. The method of claim 1, wherein the semiconductor oxide layer fills each of the first trenches.

11. The method of claim 1, wherein the semiconductor oxide layer is formed in each of the first trenches to reduce a width of each of the first trenches and is formed in each of the second trenches to reduce a width of each of the second trenches.

12. The method of claim 11, wherein the second dielectric layer fills the plurality of first trenches having the reduced width and the plurality of second trenches having the reduced width.

13. The method of claim 1, wherein the second dielectric layer comprises a flowable dielectric material.

14. The method of claim 1, wherein the first dielectric layer and the second dielectric layer comprise a same material.

15. The method of claim 1, wherein the first dielectric layer and the second dielectric layer comprise different materials.

16. The method of claim 1, further comprising performing a planarization after the forming of the second dielectric layer.

17. The method of claim 16, further comprising forming a patterned hard mask on each of the first island structures and each of the second island structures, wherein the patterned hard mask is exposed after the performing of the planarization.

18. The method of claim 16, wherein a top surface of the patterned hard mask, topmost portions of the first dielectric layer, and a top surface of the second dielectric layer are coplanar.

* * * * *